Oct. 21, 1969 A. J. MOSES 3,474,345
PUSH-PULL AMPLIFIER APPARATUS
Filed Oct. 3, 1966
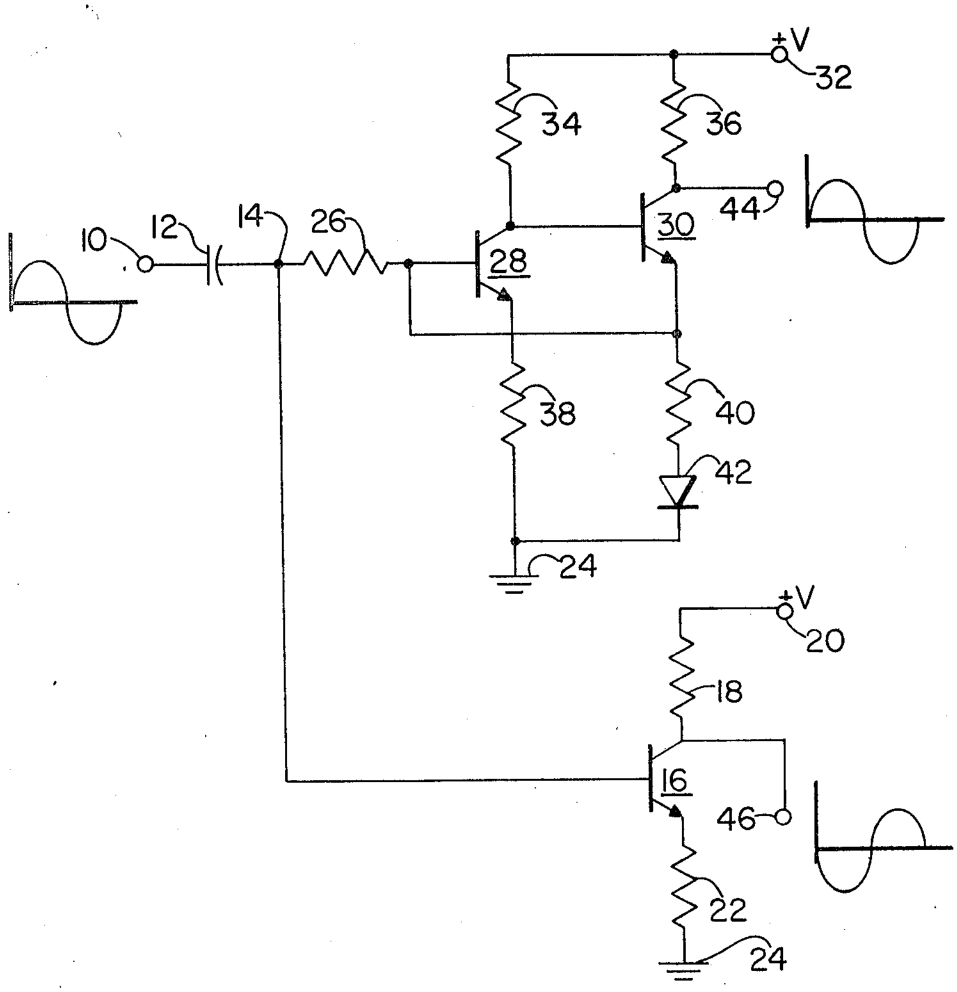
INVENTOR.
ADRIAN J. MOSES
BY Bruce C. Lutz
ATTORNEY

United States Patent Office 3,474,345
Patented Oct. 21, 1969

3,474,345
PUSH-PULL AMPLIFIER APPARATUS
Adrian J. Moses, Rush City, Minn., assignor to Honeywell Inc., Minneapolis, Minn., a corporation of Delaware Filed Oct. 3, 1966, Ser. No. 583,647
Int. Cl. H03f 3/26
U.S. Cl. 330—15 7 Claims

ABSTRACT OF THE DISCLOSURE

This invention relates generally to electronic circuitry, more particularly to electronic circuitry which forms a push-pull amplifier, and more specifically to electronic circuitry forming a push-pull amplifier where one side, section, or part of the amplifier circuit forms a very stable DC bias and shares that bias with the other side of the amplifier.

BACKGROUND OF THE INVENTION

This circuit was designed to fill the need for a push-pull amplifier which: (1) eliminated a phase splitting driver; (2) had very good bias stability; and (3) had good gain stability. The present amplifier fulfills this need since: (1) one side of the amplifier of the present invention is non-inverting and the other side is inverting thereby eliminating the need for a phase splitting driver; (2) the first side of the amplifier of the present invention creates a very stable bias and supplies that bias to both sides of the amplifier thereby creating a high degree of bias stability for the entire amplifier; (3) both sides of the amplifier of the present invention may have gain degeneration and thus have good gain stability.

DESCRIPTION OF THE INVENTION

It is an object of this invention to provide a new and novel push-pull amplifier where one side of the push-pull amplifier creates a very stable bias and provides this bias to the other side of the amplifier.

Further objects and advantages will become apparent from a reading of the specification and claims in conjunction with the single figure which shows a preferred embodiment of a push-pull amplifier using the teachings of the present invention.

The drawing shows a terminal 10 adapted to receive an input signal to be amplified. A bias isolating capacitor 12 is connected between input terminal 10 and a junction point 14. A base of a transistor 16 is also connected to junction point 14. A resistor 18 is connected between a collector of transistor 16 and a source of bias voltage 20. Resistor 18 and the bias source comprise a bias network. Another resistor 22 is connected between the emitter of transistor 16 and a ground potential 24. Again, resistor 22 and ground potential 24 comprise a biasing network. A resistor 26 is connected between junction point 14 and a base of a transistor 28. A collector of transistor 28 is connected to a base of a second transistor 30 and to a voltage supply 32 through a resistor 34. A collector of transistor 30 is also connected to voltage supply 32 through a resistor 36. An emitter of transistor 28 is connected to the ground potential 24 through a resistor 38. An emitter of transistor 30 is also connected to ground potential 24 through a series connection of a resistor 40 and a diode 42. Diode 42 is inserted so as to conduct current in the direction of the normal biasing current for transistor 30. The emitter of transistor 30 is also connected to the base of transistor 28. Output means 44 and 46 are connected to the collector of transistor 30 and the collector of transistor 16 respectively.

OPERATION OF THE INVENTION

Transistors 28 and 30 form a DC feedback pair—such as is shown and explained in an article entitled "The DC Feedback Pair" by G. W. Short in the December 1961 issue of Wireless World on page 637. The connection between the emitter of transistor 30 and the base of transistor 28 provides negative bias and gain feedback such that the bias appearing at the base of transistor 28 is extremely stable and substantially independent of the transistor parameters and temperature. Diode 42 is inserted in the circuit to lift the voltage appearing at the base of transistor 30 and hence the voltage occurring at the collector of transistor 28 so that the collector to emitter voltage of transistor 28 is greater than its saturation potential. It will be noticed that the DC feedback pair formed by transistors 28 and 30 is a non-inverting amplifier since there is an inversion of signal in transistor 28 and a second inversion in transistor 30. In other respects the DC feedback pair amplifier acts like a normal amplifier familiar to those skilled in the art.

The amplifier formed by transistor 16 and its associated circuitry is also well known to those skilled in the art.

By connecting the base of transistor 16 to the base of transistor 28 through resistor 26, the stable bias provided to the base of transistor 28 is also provided to the base of transistor 16. This means that both sides of the push-pull amplifier derive their base bias from the same stable source. Resistor 26 is in the circuit to help balance the gains between the two sides of the push-pull amplifier so that a truly symmetrical output is derived from a symmetrical input.

Capacitor 12 blocks the bias from any drive circuit from interfering with a stable bias on the push-pull amplifiers.

It is seen that the gain of the amplifier formed by transistor 16 is degenerated by resistor 22, and the gain of the DC feedback pair amplifier is degenerated by resistors 38 and 40. This causes much higher gain stability than is otherwise possible.

It will be realized by those skilled in the art that many configurations may be used to replace the DC feedback pair. It would be obvious to substitute another configuration having two or more transistors for the circuit shown.

It would also be obvious to those skilled in the art to use an inherently stable DC feedback arrangement, in place of the DC feedback pair, which inverted the signal and then replace the amplifier formed by transistor 16 with a non-inverting two stage amplifier.

Other alterations and variations will be obvious to those skilled in the art. I do not wish to be limited to the specification or the particular embodiment shown in the figure but only by the following claims in which I intend to cover all modifications which do not depart from the spirit or scope of this invention.

I claim:

1. Electrical apparatus forming a push-pull amplifier, comprising:
   - a first amplifier including input means and output means having a plurality of transistor amplifying stages connected so as to stabilize the DC bias and the DC operating points of said transistor amplifying stages;
   - a second amplifier including input means and output means providing an output signal of opposite polarity from that of the first amplifier in response to the same input signal;
   - means for providing the stabilized DC bias of the first amplifier to bias the second amplifier;
   - apparatus input means connected to the input means of said first amplifier and said second amplifier for providing an input signal thereto; and apparatus output means connected to said output means of said first mentioned amplifier and to said output means of said second mentioned amplifier for providing a push-pull output in response to an input at said apparatus input means.

2. The apparatus of claim 1 wherein the first amplifier comprises:

a plurality of transistors of the same conductivity type;

means for connecting the collector of the first transistor to the base of the second transistor, and the emitter of the second transistor to the base of the first transistor; and means for connecting the collector of each transistor to a first bias potential and for connecting the emitter of each transistor to a second bias potential.

3. The apparatus of claim 2 wherein the second amplifier comprises:

a transistor having a collector and an emitter connected to sources of bias;

a base connected to said input means; and said output means connected to the collector.

4. The apparatus of claim 3 wherein the joining means comprises means connecting the base of the second amplifier and the base of the first transistor of the first amplifier.

5. A push-pull amplifier comprising the parallel connection of:

one amplifier for providing a first side of the push-pull amplifier, including a plurality of amplifying stages and providing bias stabilization and gain degeneration;

another amplifier providing the second side of the push-pull amplifier; and means connecting said amplifiers, whereby the first amplifier provides a stable bias to the second amplifier.

6. The apparatus of claim 5 wherein the first amplifier comprises:

a plurality of transistors of the same conductivity type;

means for connecting the collector of the first transistor to the base of the second transistor and the emitter of the second transistor to the base of the first transistor; and means for connecting the collector of each transistor to a bias potential and for connecting the emitter of each transistor to a second bias potential.

7. The apparatus of claim 6 wherein the second amplifier comprises:

a transistor having a collector and an emitter connected to sources of bias;

a base connected to said input means; and said output means connected to the collector.

References Cited

UNITED STATES PATENTS 3,259,848 7/1966 Rado ---------------- 330—14

OTHER REFERENCES

G. W. Short: "The D.C. Feedback Pair," Wireless World, pp. 637–642, December 1961.

ROY LAKE, Primary Examiner

LAWRENCE J. DAHL, Assistant Examiner

U.S. Cl. X.R.

330—22, 30